US012313306B1

(12) United States Patent
Ilercil

(10) Patent No.: US 12,313,306 B1
(45) Date of Patent: May 27, 2025

(54) PORTABLE THERMOELECTRIC ADAPTIVE ENVIRONMENT SYSTEM WITH INTELLIGENT POWER MANAGEMENT

(71) Applicant: AMBASSADOR ASSET MANAGEMENT LIMITED PARTNERSHIP, Mesa, AZ (US)

(72) Inventor: Alp Ilercil, Scottsdale, AZ (US)

(73) Assignee: AMBASSADOR ASSET MANAGEMENT LIMITED, Mesa, AZ (US)

( * ) Notice: Subject to any disclaimer, the term of this patent is extended or adjusted under 35 U.S.C. 154(b) by 317 days.

(21) Appl. No.: 18/159,629

(22) Filed: Jan. 25, 2023

Related U.S. Application Data

(60) Provisional application No. 63/302,922, filed on Jan. 25, 2022.

(51) Int. Cl.
*F25B 21/02* (2006.01)
*F25D 11/00* (2006.01)
(Continued)

(52) U.S. Cl.
CPC ............ *F25B 21/02* (2013.01); *F25D 11/003* (2013.01); *H10N 10/10* (2023.02);
(Continued)

(58) Field of Classification Search
CPC ............ F25B 2321/0212; H02J 7/0063; F25D 2700/14; F25D 2700/12; F25D 2400/12; F25D 11/003; H10N 10/10
See application file for complete search history.

(56) References Cited

U.S. PATENT DOCUMENTS 3,626,704 A   12/1971  Coe, Jr.
3,823,567 A    7/1974  Corini
              (Continued)

FOREIGN PATENT DOCUMENTS

CA   2810306 A1   2/2007
EP   0417607      3/1991
              (Continued)

OTHER PUBLICATIONS

International Search Report and Written Opinion of PCT/US2010/022459 dated Mar. 23, 2010.

*Primary Examiner* — Cassey D Bauer
(74) *Attorney, Agent, or Firm* — FULLER IP LAW LLC

(57) ABSTRACT

A portable thermoelectric adaptive environment device is disclosed. The device includes a vessel for holding temperature sensitive goods, a thermoelectric heat pump in thermal contact with the vessel, a housing, and a temperature control system communicatively coupled to the thermoelectric heat pump and a battery. The temperature control system includes a microcontroller and a plurality of sensors configured to monitor an internal temperature and an ambient temperature. The microcontroller is configured to maintain the vessel at a target temperature by requesting a voltage and a current from the battery with a request made using a two-way communication protocol and powering the heat pump at the voltage and the current provided in response to the request. The microcontroller may be communicatively coupled to the battery through at least one trigger configured to communicate with the battery using the two-way communication protocol.

20 Claims, 6 Drawing Sheets

(51) Int. Cl.
*H02J 7/00* (2006.01)
*H10N 10/10* (2023.01)

(52) U.S. Cl.
CPC ...... *F25D 2400/12* (2013.01); *F25D 2700/12* (2013.01); *F25D 2700/14* (2013.01); *H02J 7/0063* (2013.01)

(56) References Cited

U.S. PATENT DOCUMENTS

| | | |
|---|---|---|
| 4,066,365 A | 1/1978 | Staunton |
| 4,326,383 A | 4/1982 | Reed |
| 4,328,427 A | 5/1982 | Bond |
| 4,364,234 A | 12/1982 | Reed |
| 5,022,928 A | 6/1991 | Buist |
| 5,514,094 A | 5/1996 | Anello |
| 5,576,512 A | 11/1996 | Doke |
| 5,605,048 A | 2/1997 | Kozlov |
| 5,641,400 A | 6/1997 | Kaltenbach |
| 5,655,375 A | 8/1997 | Ju |
| 5,705,770 A | 1/1998 | Ogasawara |
| 5,802,863 A | 9/1998 | Cowans |
| 5,892,656 A | 4/1999 | Bass |
| 6,076,357 A | 6/2000 | Holdren |
| 6,260,360 B1 | 7/2001 | Wheeler |
| 6,401,461 B1 | 6/2002 | Harrison |
| 6,463,743 B1 | 10/2002 | Laliberte |
| 6,467,275 B1 | 10/2002 | Ghoshal |
| 6,519,948 B2 | 2/2003 | Zorn |
| 6,658,857 B1 | 12/2003 | George |
| 6,771,183 B2 | 8/2004 | Hunter |
| 6,959,555 B2 | 11/2005 | Bell |
| 7,000,490 B1 | 2/2006 | Micheels |
| 2005/0039465 A1 | 2/2005 | Welch |
| 2006/0204950 A1 | 9/2006 | Ilercil |
| 2008/0236175 A1 | 10/2008 | Chaparro Monferrer |
| 2008/0245398 A1 | 10/2008 | Bell |
| 2009/0049845 A1 | 2/2009 | McStravick |
| 2009/0272125 A1 | 11/2009 | Chan |
| 2009/0277187 A1 | 11/2009 | Mcgann |
| 2012/0042661 A1 | 2/2012 | Danenberg |
| 2013/0188667 A1 | 7/2013 | Edwards |
| 2013/0276464 A1 | 10/2013 | Chien |
| 2014/0097772 A1 | 4/2014 | Versailles |
| 2017/0211854 A1 | 7/2017 | Crocco |
| 2020/0248935 A1* | 8/2020 | Born ............... F25D 11/02 |

FOREIGN PATENT DOCUMENTS

| | | |
|---|---|---|
| WO | 8912502 | 12/1989 |
| WO | 0108800 | 2/2001 |
| WO | 2010088433 A1 | 8/2010 |
| WO | 2015178929 | 11/2015 |

* cited by examiner

PORTABLE THERMOELECTRIC ADAPTIVE ENVIRONMENT SYSTEM WITH INTELLIGENT POWER MANAGEMENT

RELATED APPLICATIONS

This application claims the benefit of U.S. provisional patent application 63/302,922, filed Jan. 25, 2022, titled "Portable Thermoelectric Adaptive Environment System with Intelligent Power Management," the entirety of the disclosure of which is hereby incorporated by this reference.

TECHNICAL FIELD

Aspects of this document relate generally to active temperature-controlled containers with intelligent power management for transporting sensitive goods.

BACKGROUND

A wide variety of goods are shipped throughout the world every day where the goods are small enough for one person to carry. Some of these goods shipped are required to maintain particular temperatures or other physical characteristics to avoid spoiling or other damage. One option for maintaining cold or hot temperatures is to employ active temperature-controlled containers with a number of thermocouples to actively apply the Peltier effect to transport heat towards (to heat) or away from (to cool) temperature sensitive goods.

The Peltier effect is the presence of heating or cooling at an electrified junction of two different conductors. The Peltier effect has been advantageously used in harnessing thermoelectric effects whereby temperature differences are directly converted to electric voltages, and vice versa. Accordingly, a thermoelectric heat pump may be built to include a plurality of thermocouples that include a junction of two different conductors that are electrified at the junction to create heating or cooling of the sensitive goods within the container.

Conventional active temperature-controlled containers, or adaptive environment devices, tend to be heavy, bulky, and have short operability times. The power requirements of such a device depend strongly on the context in which it is being used. Conventional devices typically make use of pulse-width modulation to vary the power being delivered to a heat pump, or modifying the voltage by modifying the number of battery cells being employed. Both of these approaches introduce operating inefficiencies, as well as manufacturing inefficiencies (e.g., two use cases could be efficiently addressed by identical hardware if not for the differing power requirements).

SUMMARY

According to one aspect, a portable thermoelectric adaptive environment device includes a vessel for holding temperature sensitive goods, a thermoelectric heat pump in thermal contact with the vessel, and a temperature control system communicatively coupled to the thermoelectric heat pump and a battery. The temperature control system includes a microcontroller and a plurality of sensors configured to monitor at least an internal temperature of the vessel and an ambient temperature proximate the portable thermoelectric adaptive environment device. The microcontroller is communicatively coupled to the battery through at least one trigger configured to communicate with the battery using a two-way communication protocol. The microcontroller is configured to maintain the vessel at a target temperature by instructing a trigger of the at least one trigger to request a voltage and a current from the battery through a request made using the two-way communication protocol and powering the thermoelectric heat pump at the voltage and the current provided by the battery in response to the request. The device also includes a housing enclosing the vessel, the thermoelectric heat pump, the battery, and the temperature control system.

Particular embodiments may comprise one or more of the following features. The at least one trigger may include a plurality of static triggers. Each static trigger of the plurality of static triggers may be configured to request a predefined voltage and/or a predefined current from the battery using the two-way communication protocol. The request may be made in response to an instruction received by the static trigger from the microcontroller. The at least one trigger may include a dynamic trigger that may be configured to request a configurable voltage and/or a configurable current from the battery using the two-way communication protocol. The request may be made in response to an instruction received by the dynamic trigger from the microcontroller indicating the configurable voltage and the configurable current to be requested. The configurable voltage may be chosen by the microcontroller from a range of voltages. The configurable current may be chosen by the microcontroller from a range of currents. The at least one trigger may be integral with the temperature control system. The at least one trigger may be one trigger. The device may further include a power interface that may be configured to couple the temperature control system with an external power source. The temperature control system may further be configured to instruct the battery to receive power using the two-way communication protocol and then to charge the battery while also powering the thermoelectric heat pump at the current and the voltage to maintain the vessel at the target temperature while the power interface is coupled to the external power source.

According to another aspect of the disclosure, a portable thermoelectric adaptive environment device includes a vessel for holding temperature sensitive goods, a thermoelectric heat pump in thermal contact with the vessel, and a temperature control system communicatively coupled to the thermoelectric heat pump and a battery. The temperature control system includes a microcontroller and a plurality of sensors configured to monitor at least an internal temperature of the vessel and an ambient temperature proximate the portable thermoelectric adaptive environment device. The microcontroller is configured to maintain the vessel at a target temperature by requesting a voltage and a current from the battery with a request made using a two-way communication protocol and powering the thermoelectric heat pump at the voltage and the current provided by the battery in response to the request. The device also includes a housing enclosing the vessel, the thermoelectric heat pump, and the temperature control system.

Particular embodiments may comprise one or more of the following features. The battery may be inside the housing. The battery may be removable. The thermoelectric heat pump may be also communicatively coupled to the battery directly, such that the thermoelectric heat pump is powered directly by the battery at the voltage and the current, bypassing the temperature control system. The microcontroller may be communicatively coupled to the battery through at least one trigger that may be configured to communicate with the battery using the two-way communication protocol. The at least one trigger may include a plurality of static triggers, each static trigger of the plurality of static triggers being configured to request a predefined voltage and a predefined current from the battery using the two-way communication protocol. The request may be made in response to an instruction received by the static trigger from the microcontroller. The at least one trigger may include a dynamic trigger that may be configured to request a configurable voltage and a configurable current from the battery using the two-way communication protocol. The request may be made in response to an instruction received by the dynamic trigger from the microcontroller indicating the configurable voltage and the configurable current to be requested. The configurable voltage may be chosen by the microcontroller from a range of voltages. The configurable current may be chosen by the microcontroller from a range of currents. The at least one trigger may be integral with the temperature control system. The two-way communication protocol may be the USB Power Delivery (USB-PD) protocol. The two-way communication protocol may be the USB Power Delivery Programmable Power Supply protocol. The device further may include a power interface configured to couple the temperature control system with an external power source. The temperature control system may further be configured to instruct the battery to receive power using the two-way communication protocol and then to charge the battery while also powering the thermoelectric heat pump at the current and the voltage to maintain the vessel at the target temperature while the power interface is coupled to the external power source. The power interface may include a cable communicatively coupled to the temperature control system and extending outside the housing. The battery may be inside the housing and communicatively coupled to a port configured to receive and releasably couple to the cable such that the battery is communicatively coupled to the temperature control system through the cable.

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112 (f). Thus, the use of the words "function," "means" or "step" in the Detailed Description or Description of the Drawings or claims is not intended to somehow indicate a desire to invoke the special provisions of 35 U.S.C. § 112 (f), to define the invention. To the contrary, if the provisions of 35 U.S.C. § 112 (f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112 (f). Moreover, even if the provisions of 35 U.S.C. § 112 (f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

The disclosure will hereinafter be described in conjunction with the appended drawings, where like designations denote like elements, and.

DETAILED DESCRIPTION

Figure 1A:
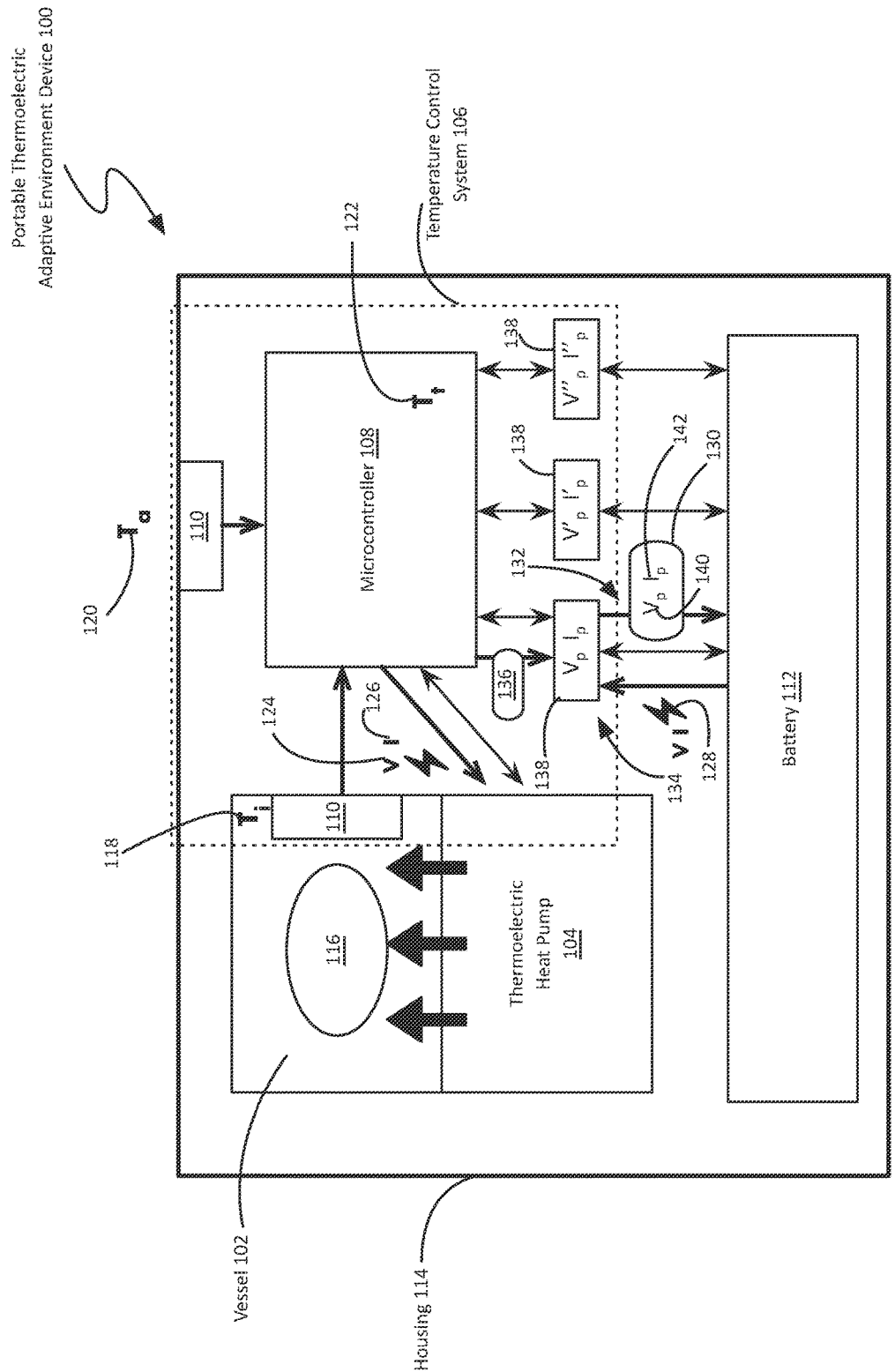
FIG. 1A is a schematic view of a portable thermoelectric adaptive environment device with static triggers.

This disclosure, its aspects and implementations, are not limited to the specific material types, components, methods, or other examples disclosed herein. Many additional material types, components, methods, and procedures known in the art are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

While this disclosure includes a number of embodiments in many different forms, there is shown in the drawings and will herein be described in detail particular embodiments with the understanding that the present disclosure is to be considered as an exemplification of the principles of the disclosed methods and systems, and is not intended to limit the broad aspect of the disclosed concepts to the embodiments illustrated.

A wide variety of goods are shipped throughout the world every day. Some of these shipped goods are small enough for one person to carry, and are required to maintain particular temperatures or other physical characteristics to avoid spoiling or other damage. One option for maintaining cold or hot temperatures is to employ active temperature-controlled containers with a number of thermocouples to actively apply the Peltier effect to transport heat towards (to heat) or away from (to cool) temperature sensitive goods.

The Peltier effect is the presence of heating or cooling at an electrified junction of two different conductors. The Peltier effect has been advantageously used in harnessing thermoelectric effects whereby temperature differences are directly converted to electric voltages, and vice versa. Accordingly, a thermoelectric heat pump may be built to include a plurality of thermocouples that include a junction of two different conductors that are electrified at the junction to create heating or cooling of the sensitive goods within the container.

Conventional active temperature-controlled containers, or adaptive environment devices, tend to be heavy, bulky, and have short operability times. The power requirements of such devices depend strongly on the context in which they are being used. Conventional devices typically make use of pulse-width modulation to vary the power being delivered to a heat pump, or modifying the voltage by modifying the number of battery cells being employed. Both of these approaches introduce operating inefficiencies, as well as manufacturing inefficiencies (e.g., two use cases could be efficiently addressed by identical hardware if not for the differing power requirements, etc.).

Contemplated herein is a portable thermoelectric adaptive environment device (hereinafter "adaptive environment device" or simply "device") with intelligent power management. Rather than receiving whatever power the battery is designed to deliver and then modifying it to meet the particular needs of that adaptive environment, the contemplated device communicates with the battery or other power supply, requesting a desirable voltage/current to best accomplish the desired environmental manipulation. Not only does this allow the device to operate with greater efficiency and with a greater overall device lifespan, according to some embodiments the contemplated devices may also simplify device production, allowing a single design to be used in a wider range of contexts that would require different hardware configurations using conventional methods.

Much effort has been made to increase the lifespan, speed, and efficiency of modern rechargeable batteries. For example, recent USB standards include the quick charge and power delivery protocols. These protocols increase the speed at which a battery may be charged, without damaging the lifespan of the battery. These standards are conventionally used for charging a battery. However, according to various embodiments, these or similar standards may be employed to efficiently draw power from a battery, for use within an adaptive environment device.

It should be noted that while some of the non-limiting examples discussed below are given in the context of particular USB standards, those skilled in the art will recognize that the contemplated devices and methods may be adapted for use with other standards permitting communication between a power source (e.g., battery) and a device.

Figure 1B:
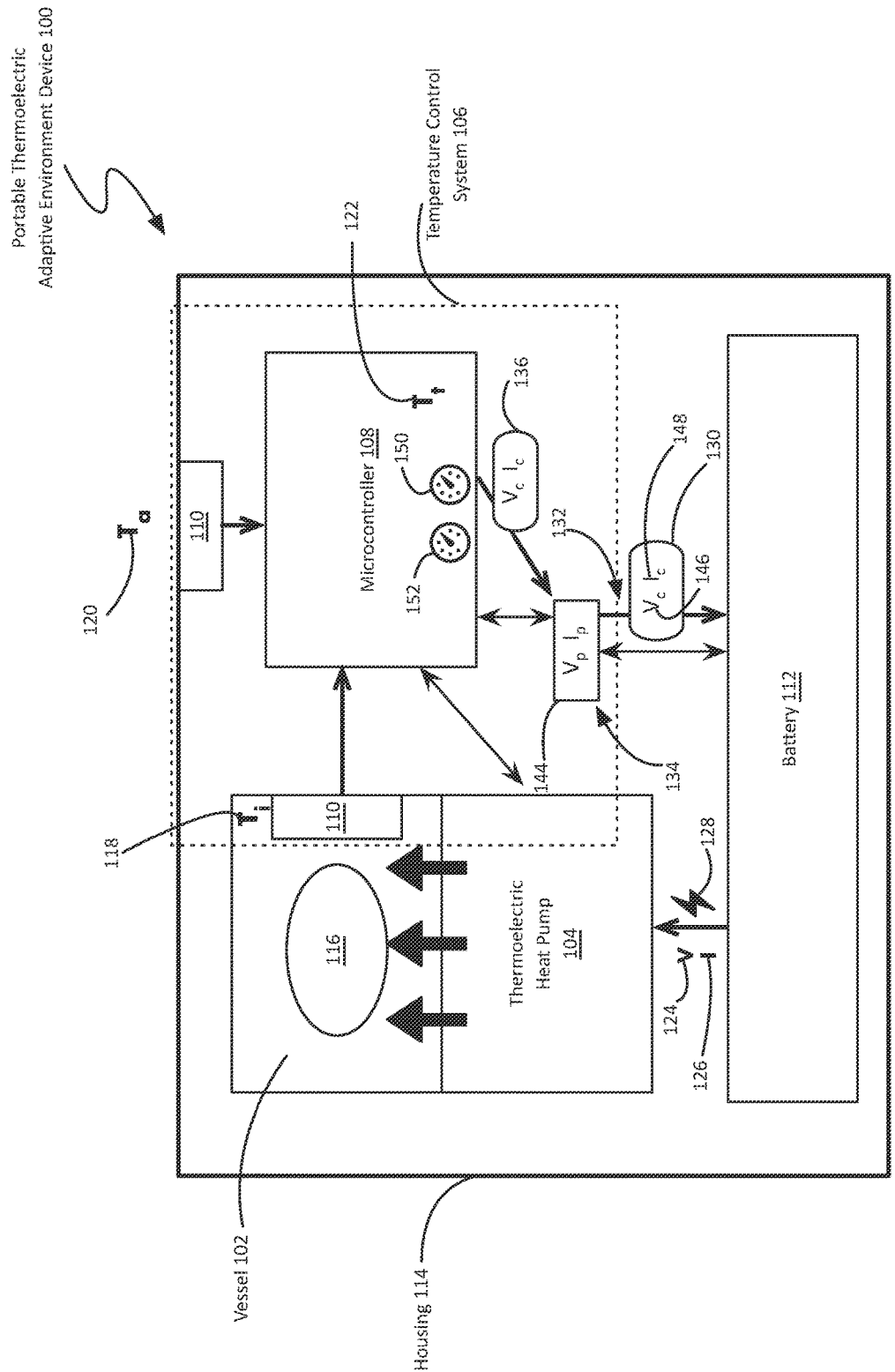
FIG. 1B is a schematic view of a portable thermoelectric adaptive environment device with a dynamic trigger.
Figure 1C:
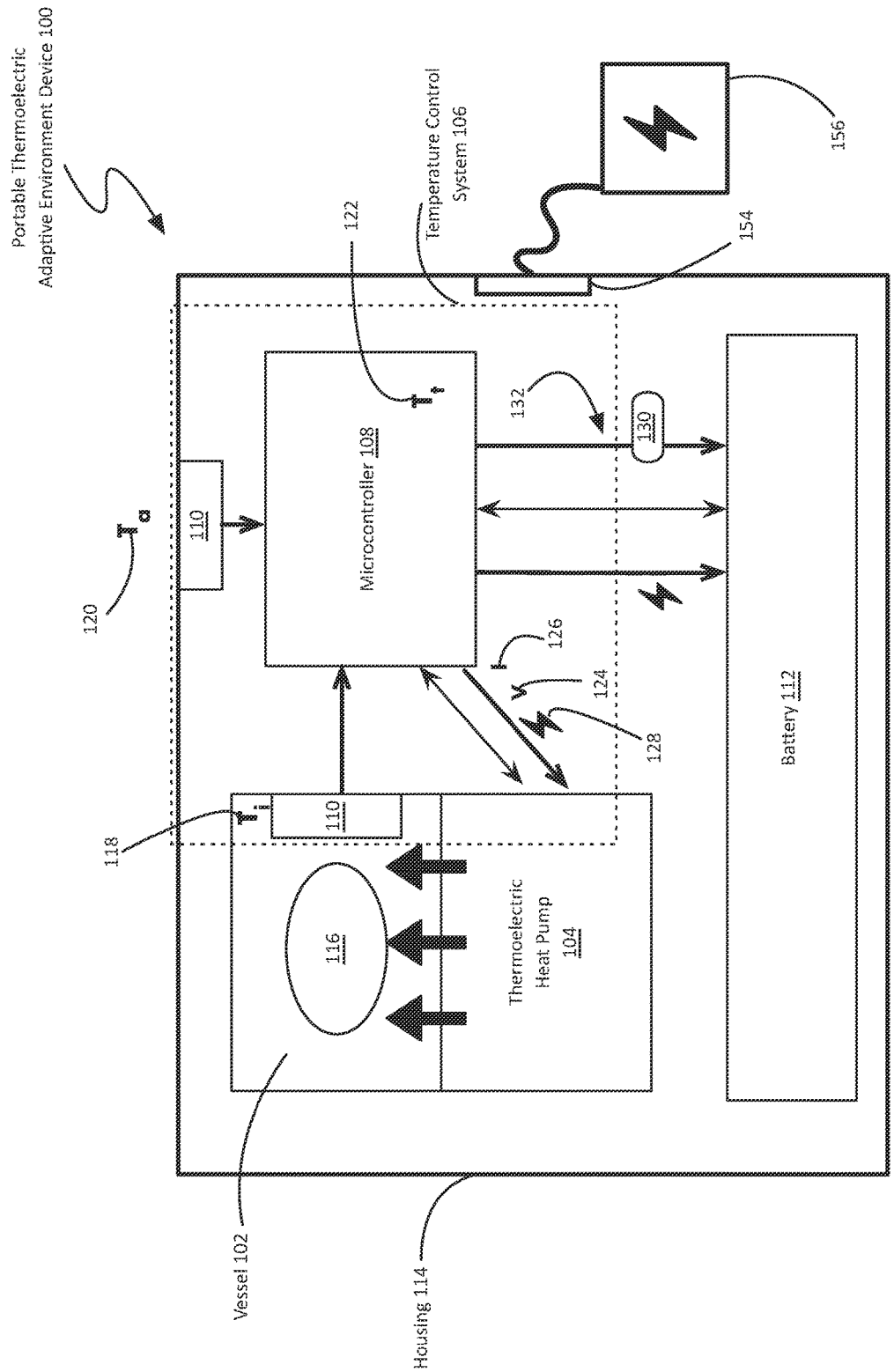
FIG. 1C is a schematic view of a portable thermoelectric adaptive environment device configured for direct communication.

FIGS. 1A-1C are schematic views of non-limiting examples of a portable thermoelectric adaptive environment device 100. Specifically, FIG. 1A is a schematic view of a portable thermoelectric adaptive environment device 100 with static triggers 138, FIG. 1B is a schematic view of a portable thermoelectric adaptive environment device 100 with a dynamic trigger 144, and FIG. 1C is a schematic view of a portable thermoelectric adaptive environment device 100 configured for direct communication between a microcontroller 108 and a battery 112. Each of these differences will be discussed in greater detail, below.

As shown in FIGS. 1A-1C, the contemplated portable thermoelectric adaptive environment device 100 (hereinafter "adaptive environment device 100" or "device 100") comprises a vessel 102 for holding temperature sensitive goods 116, a thermoelectric heat pump 104, a temperature control system 106 having a plurality of sensors 110, and a battery 112. According to some embodiments, all these components may be enclosed within a housing 114. In other embodiments, the battery 112 may be external to the housing 114 and coupled to the rest of the device 100 through an external port 202 (see FIGS. 2A-2C) on the housing 114.

According to various embodiments, the vessel 102 is a space within the device 100 configured to hold temperature sensitive goods 116 in transit. Examples of sensitive goods 116 include, but are not limited to, mammal biological matter, mammal reproductive cells and/or tissues, horse semen, cell and tissue cultures, nucleic acids, semen, stem-cells, ovaries, equine reproductive matter, bodily fluids, tissues, organs, and/or embryos plant tissues, blood, platelets, fruits, vegetables, seeds, live insects and other live samples, barely-frozen foods, fresh foods, pharmaceuticals, vaccines, chemicals, and sensitive goods yet to be developed. According to various embodiments, the vessel 102 is sealable; in some embodiments, the vessel 102 may be sealed air and/or watertight (within a range of pressures), while in other embodiments, the vessel 102 may be sealed but remain air permeable.

The vessel 102 is in thermal contact with one or more thermoelectric (TE) heat pumps 104, meaning the one or more heat pumps 104 can manipulate the temperature within the vessel 102. The thermoelectric heat pump 104 provides active temperature control to the vessel 102, maintaining a desired or target temperature 122 despite varying conditions outside the vessel 102. According to various embodiments, the thermoelectric heat pump 104 (s) comprise one or more layers of thermoelectric semi-conductor materials. Specifically, in some embodiments, the thermoelectric heat pump 104 may comprise a single layer of thermoelectric material, while in other embodiments, the thermoelectric heat pump 104 may comprise two, three, four, or more layers of thermoelectric semiconductor nodes which may be connected in series, in parallel, or both, as is known in the art. The thermoelectric semiconducting nodes are interleaved with thermoelectric capacitor layers, forming bidirectional heat-pump(s), according to various embodiments.

In a specific embodiment, the one or more thermoelectric semi-conductor node(s) of the thermoelectric heat pump 104 can comprise bismuth-telluride that can be secured with electrically-conductive thermal adhesive, such as silver-filled two-component epoxy. Thin-film thermal epoxy can fill any microscopic imperfections at the interface between each layer of thermoelectric capacitor and thin non-electrically conductive layer. A thermoelectric semi-conductor node may comprise banks of electrically parallel-connected bismuth-telluride semiconductors that are in-turn electrically connected in series and interconnected to a power source, such as a battery or other source. Other embodiments may employ one or more thermoelectric heat pumps 104 having a different architecture, material(s), connectivity, and the like.

It should be noted that the role of the thermoelectric heat pump 104 is to use electricity to manipulate the temperature within the vessel 102. While specific examples have been provided, those skilled in the art will recognize that the contemplated device 100 may be adapted for use with other electric temperature manipulation technologies, including technologies not yet existing. The advantages provided by the intelligent power management of the contemplated device 100 may be extended to other types of heat pumps or similar technologies. For example, other heating and/or cooling devices may be used instead of a thermoelectric heat pump. In some embodiments, the portable adaptive environment device 100 may modify some aspect of the environment within the vessel 102 other than, or in addition to, temperature. Examples include, but are not limited to, humidity (e.g., using a desiccant, etc.), pressure (e.g., using a pump, etc.), atmosphere (e.g., using electric valves and inert gas source, etc.), light, and the like.

The thermoelectric heat pump 104 is communicatively coupled to a temperature control system 106. In the context of the present description and the claims that follow, a temperature control system 106 is responsible for monitoring the temperature within and surrounding the vessel 102 and utilizing the thermoelectric heat pump 104 to modify the vessel 102 temperature to maintain a desired temperature (i.e., target temperature 122) within a tolerance range. According to various embodiments, the temperature control system 106 comprises a microcontroller 108 configured to monitor and maintain said temperature. Specifically, the microcontroller 108 is configured to maintain the vessel 102 at a target temperature 122 by requesting a voltage 124 and a current 126 from the battery 112 using a two-way communication protocol 132, according to various embodiments. The two-way communication protocol 132 will be discussed in greater detail, below.

As shown, the microcontroller 108 is communicatively coupled to a plurality of sensors 110 coupled to the microcontroller 108. According to various embodiments, these sensors 110 include at least one sensor 110 to monitor the internal temperature 118 of the vessel 102, and may also include at least one sensor 110 to monitor the ambient temperature 120 proximate the portable thermoelectric adaptive environment device 100 (e.g., the air temperature detected by a sensor 110 embedded in the outer surface of the housing 114, etc.). Temperature sensors 110 may be based upon direct contact (e.g., thermocouple, etc.) or contactless (e.g., infrared, etc.), according to various embodiments. Furthermore, as discussed above, some embodiments of the contemplated device 100 may be concerned with more than just temperature. Such embodiments may employ additional sensors 110 to monitor other environmental aspects of interest.

The thermoelectric heat pump 104 is communicatively coupled to a battery 112, as shown. In some embodiments, said coupling may be via the temperature control system 106, while in other embodiments, the heat pump 104 and battery 112 may each be coupled to the temperature control system 106 in addition to having a direct connection between the battery 112 and the TE heat pump 104. As shown in FIG. 1C, in some embodiments, the device 100 may also be configured to be powered by a non-portable power source, or a power source 156 mounted to a structure external to the device 100 (e.g., electrical system of a vehicle, mains power, etc.).

According to various embodiments, the contemplated device 100 may be compatible with modern battery technologies that are able to maintain a particular voltage until depleted. This is advantageous over older battery technologies, which tended to start at one voltage when fully charged, and then slowly drift to lower voltages as the charge is depleted. For example, a NiMH battery could start at 9V, and dip down to 6.4V as it depletes. This is particularly problematic when powering a TE heat pump 104, which may suddenly require a higher voltage depending on environmental changes (e.g., exposure to extreme conditions while being transferred from one vehicle to another, etc.). The methods for obtaining those higher voltages introduce additional inefficiencies and manufacturing expenses. As will be discussed below, batteries 112 compatible with some modern charging/discharging standards may advantageously be able to provide a particular voltage 124 throughout the discharge cycle.

Conventional portable temperature-controlled devices often require specialized portable power sources configured to provide power at various voltages (e.g., through engaging a changing numbers of cells, etc.). According to various embodiments, the contemplated device 100 may utilize off-the-shelf rechargeable batteries 112, obtaining the desired performance through the use of a two-way communication protocol 132, which will be discussed below. In some embodiments, the battery 112 may be removable, while in other embodiments, the battery 112 may be permanently attached to the other components of the contemplated adaptive environment device 100.

It should be noted that while the following discussion of various embodiments, including the non-limiting examples shown schematically in FIGS. 1A-1C, speak of the device having a single battery 112, in other embodiments the contemplated portable thermoelectric adaptive environment device 100 may have multiple batteries 112. For example, some embodiments may have the ability to utilize multiple removable batteries, permitting the device 100 to be modified to meet the needs of a particular situation by giving up battery capacity to reduce the weight of the device 100.

The microcontroller 108 within the temperature control system 106 of the contemplated adaptive environment device 100 is configured to interact with the battery 112 using a two-way communication protocol 132. Through this two-way communication protocol 132, the microcontroller 108 can request the provisioning of power for the TE heat pump 104 having a particular voltage 124 and a particular current 126. In some embodiments, the microcontroller 108 can communicate with the battery 112 directly using said protocol 132, while in other embodiments the microcontroller 108 is communicatively coupled to the battery 112 through one or more triggers 134. Triggers 134 are components or devices which are able to converse with the battery 112 using the two-way communication protocol 132, and also interact with the microcontroller 108 in a different manner (e.g., receive an instruction 136 from the microcontroller 108, etc.). Triggers 134 will be discussed in greater detail, below.

The advancement of portable technology has resulted in devices that require increasing amounts of power, which in turn has resulted in the development of batteries with larger capacities. These expansive batteries required faster ways to charge that could also prolong the lifespan of the battery. Two-way communication protocols 132 have been developed for the purpose of rapid charging that avoid damage to the battery 112 caused by previous charging methods. Two examples of modern power/connectivity standards that include a two-way communication protocol 132 are USB Power Delivery (USB-PD) and USB Power Delivery Programmable Power Supply (USB PD PPS). Advantageous over the older USB standards that are limited to 5V, these standards can range between 5V and 20V. The USB-PD standard can be used to request predefined voltages 140 from a compatible battery 112 (i.e., 5V, 9V, 15V, and 20V), while the USB PD PPS standard supports the configurable voltages 146 within the 5V to 20V range that are not limited to those 4 values, advantageously allowing the temperature control system 106 to request the most efficient voltage 124 for a particular scenario, rather than trying to make 5V work, or using the best of the 4 options of USB-PD. These standards are also able to provide more power than previous standards, able to reach as high as 100 W in some cases.

It should be noted that these standards were developed for the charging of batteries. While the battery 112 used by the contemplated device 100 may be charged using these standards, the two-way communication protocol 132 is also employed when the battery 112 is functioning as a power source for the device 100, providing power 128 in whatever form the temperature control system 106 requests. It should also be noted that while one or both of the USB standards discussed above may be employed in some embodiments, other embodiments may employ other two-way communication protocols 132 to allow the temperature control system 106 to interact with the battery 112 including, but not limited to, the Thunderbolt standard as well as standards and protocols not yet developed.

According to various embodiments, the power 128 (specifically, the voltage 124 and the current 126) requested from the battery 112 by the microcontroller 108 is selected by the microcontroller 108 based, at least in part, on a difference between the internal temperature 118 and the ambient temperature 120 detected by the sensors 110 of the temperature control system 106. As that temperature difference increases or decreases, the power 128 needs (for efficient operation) of the TE heat pump 104 will change. The microcontroller 108 may be configured to determine those power needs based on sensor 110 readings, and then request the specific power needed from the battery 112 using a request 130 made using the two-way communication protocol 132. The nature and structure of the request 130 will depend upon the two-way communication protocol 132 that is being used. The thermoelectric heat pump 104 is powered at the voltage 124 and the current 126 provided by the battery 112 in response to the request 130.

In some embodiments, the microcontroller 108 may send messages to, and receive messages from, the battery 112 by conversing directly with the battery 112 using the two-way communication protocol 132. See, for example, the non-limiting example shown in FIG. 1C. In other embodiments, the microcontroller 108 may be communicatively coupled to the battery 112 through one or more triggers 134. In the context of the present description and the claims that follow, a trigger 134 is a device or component that is able to communicate with a battery 112 through a two-way communication protocol 132, and may be configured to perform such a communication (e.g., send a request 130 for power 128 having a voltage 124 and a current 126, etc.) in response to some sort of input or stimulus (e.g., an instruction 136 from a microcontroller 108, a signal from a sensor, etc.).

In some embodiments, the one or more triggers 134 may each be separate, discreet components or devices coupled to, but created and installed separately from, the microcontroller 108 of the temperature control system 106. As an option, in some embodiments, one or more triggers 134 may be releasably coupled, permitting them to be replaced or exchanged to tailor the adaptive environment device 100 to specific needs. In other embodiments, the one or more triggers 134 may be integral with the temperature control system 106. In still other embodiments, the microcontroller 108 may communicate directly with the battery 112, using what could be considered a "software trigger" implemented on the microcontroller 108 to converse with the battery 112 using the two-way communication protocol 132.

FIG. 1A is a schematic view of the contemplated portable thermoelectric adaptive environment device 100 making use of multiple static triggers 138. Some triggers 134 are static (e.g., the static triggers 138 of FIG. 1A), only able to request a predefined value (i.e., predefined voltage 140 and predefined current 142) using a two-way communication protocol 132. For example, a static trigger 138 may be configured such that, upon each activation, it requests power 128 at 9V and lamp. Other triggers 134 are dynamic (e.g., the dynamic trigger 144 of FIG. 1B), able to request power 128 having characteristics (i.e., voltage 124, current 126) that are provided to the trigger 134, and that may be altered during operation of the trigger 134 (e.g., the dynamic trigger 144 may first request power 128 at 20V and then at 13V per instructions 136 from the temperature control system 106 and based on the delta-T, etc.).

In some embodiments, the device 100 may have a single static trigger 138. For example, in a specific embodiment, a non-limiting example of the contemplated device 100 may comprise a 5V static trigger 138 compatible with the USB-PD standard. This may be useful in situations where the device 100 will be operating repeatedly in predictable and somewhat stable conditions. This simplification may be advantageous in the context of efficient manufacturing of the devices 100. As an option, conventional power manipulation methods such as PWM may be used in conjunction with this single static trigger 138 (or other variations of triggers 134, static and/or dynamic) to fine tune the power 128 being provided to the TE heat pump 104.

In other embodiments, the device 100 may comprise a plurality of static triggers 138, each configured to request a predefined voltage 140 and a predefined current 142 using a particular two-way communication protocol 132. Which static trigger 138 should be used in a particular situation may be determined by the microcontroller 108, and may be based at least in part, on the difference between the internal temperature 118 and the ambient temperature 120. Such an approach may advantageously give the device 100 the flexibility to be powered by (and/or charged using) more than one connectivity standard.

In embodiments where the microcontroller 108 communicates with the battery 112 through a trigger 134, be it static (see FIG. 1A) or dynamic (see FIG. 1B), the microcontroller 108 causes the trigger 134 to send a request 130 to the battery 112 by sending the trigger 134 an instruction 136. In the context of the present description and the claims that follow, an instruction 136 is an electrical signal produced by the microcontroller 108 that causes a trigger 134 to send the desired request 130 to the battery 112 resulting in the battery 112 taking a desired action (e.g., produce a particular voltage 124 and current 126, return information, halt power output and prepare to be charged, etc.). In some embodiments, the instruction 136 may be as simple as raising a voltage sent between the trigger 134 and the microcontroller 108 above a certain threshold. In other embodiments, the instruction 136 may include information for the trigger 134 to use when forming the request 130, such as a configurable current 148 and configurable voltage 146 being sent by the microcontroller 108 to a dynamic trigger 144 as an instruction 136. In some embodiments, the instruction 136 may be structured as a packet. Those skilled in the art will recognize that an instruction 136 sent from a microcontroller 108 to a trigger 134 may also be accomplished using any other electronic communication protocol or methodology known in the art.

FIG. 1B shows a schematic view of a non-limiting example of an adaptive environment device 100 employing a dynamic trigger 144. As previously discussed, in some embodiments, the device 100 may comprise one or more dynamic triggers 144 that are configured to request a voltage (i.e., a configurable voltage 146) and a current (i.e., configurable current 148) from the battery 112 using the two-way communication protocol 132, the request 130 being made in response to an instruction 136 received by the dynamic trigger 144 from the microcontroller 108 indicating the configurable voltage 146 and the configurable current 148 to be requested. Unlike the predefined current and voltage of the static trigger 138, the configurable current 148 and configurable voltage 146 are each chosen by the microcontroller 108 from a range of currents 152 and a range of voltages 150, respectively. Such an arrangement may be advantageous for devices 100 intended for use in volatile or extreme environments where conditions may change quickly and/or vary across a wide spectrum of temperatures. This flexibility may be employed to enhance the efficiency of the device 100 in operation, as well as for charging.

In some embodiments, such as the non-limiting example shown in FIG. 1A, the battery 112 may provide power 128 to the thermoelectric heat pump 104 via the temperature control system 106. In other embodiments, including the non-limiting example shown in FIG. 1B, the temperature control system 106 may send a request 130 to the battery 112 using the two-way communication protocol 132 asking for a voltage and a current, and in response the battery 112 sends the requested power 128 directly to the thermoelectric heat pump 104.

FIG. 1C shows a schematic view of a non-limiting example of the contemplated device 100, where the microcontroller 108 communicates directly with the battery 112, without using a discrete hardware trigger 134 to make requests 130. Additionally, the adaptive environment device 100 of FIG. 1C comprises a power interface 154 configured to couple the temperature control system 106 with an external power source 156 (e.g., a wall socket, etc.). In some instances, it may be desirable to power the portable thermoelectric adaptive environment device 100 using an external source of electricity, conserving battery power for instances where the device 100 is away from convenient power (e.g., while being transferred between vehicles, etc.). In some embodiments, the power interface 154 may be a port into which a power cord may be plugged. In other embodiments, the power interface 154 may be contactless, or not reliant on a physical coupling between the device 100 and the external power source 156. For example, in some embodiments, the power interface 154 may utilize induction-based power transfer, which may be advantageous in cases where a facility or service is handling a number of adaptive environment devices 100 on a regular basis. A wireless power interface 154 would allow the devices 100 to be powered without needing to be manually plugged in, which could slow down the shipping process and/or increase costs.

In some embodiments, the power interface 154 may also be used to charge the battery 112. As a specific example, in some embodiments, the temperature control system 106 may instruct the battery 112 to receive power 128 using the two-way communication protocol 132. The battery 112 would then be charged. In some embodiments, the charging may be performed by the temperature control system 106, while in other embodiments the device 100 may comprise separate power management circuitry. As an option, in some embodiments, the thermoelectric heat pump 104 may simultaneously be powered at the current 126 and the voltage 124 needed to maintain the vessel 102 at the target temperature 122. In some embodiments, all of this may automatically start when the power interface 154 is coupled to the external power source 156.

Figure 2A:
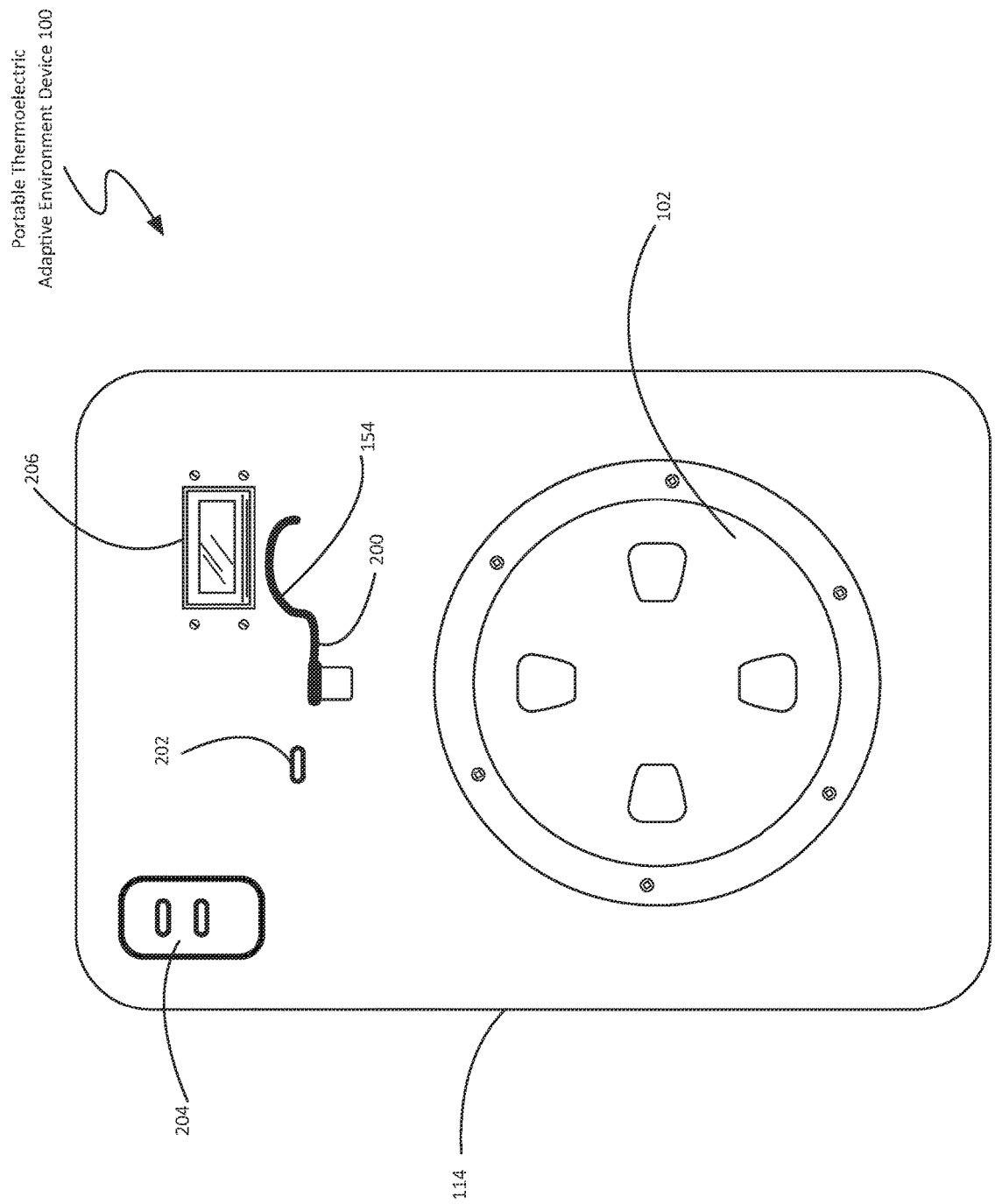
FIGS. 2A-2C are top views of a portable thermoelectric adaptive environment device configured to interface with an external power source.
Figure 2B:
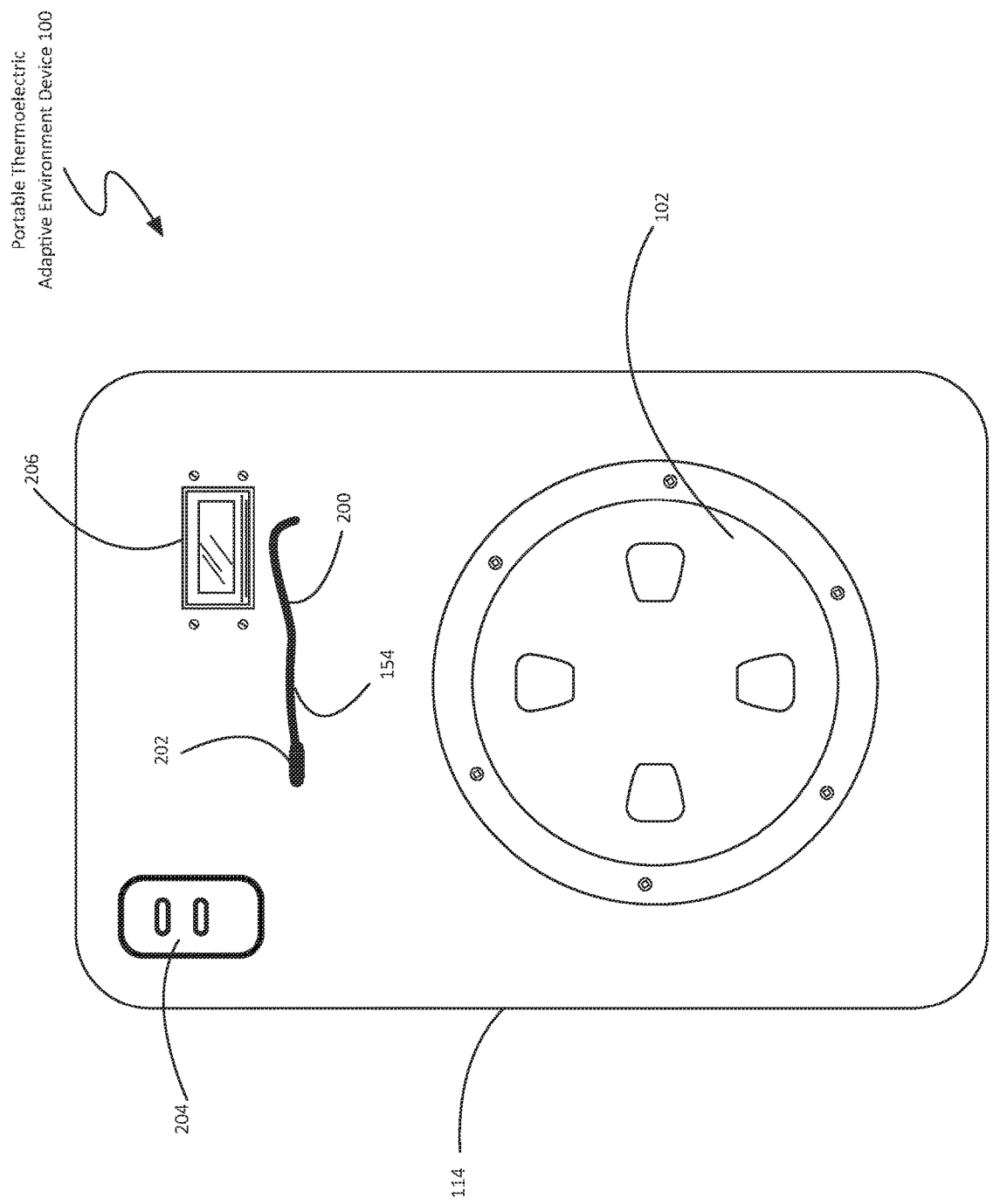
Figure 2C:
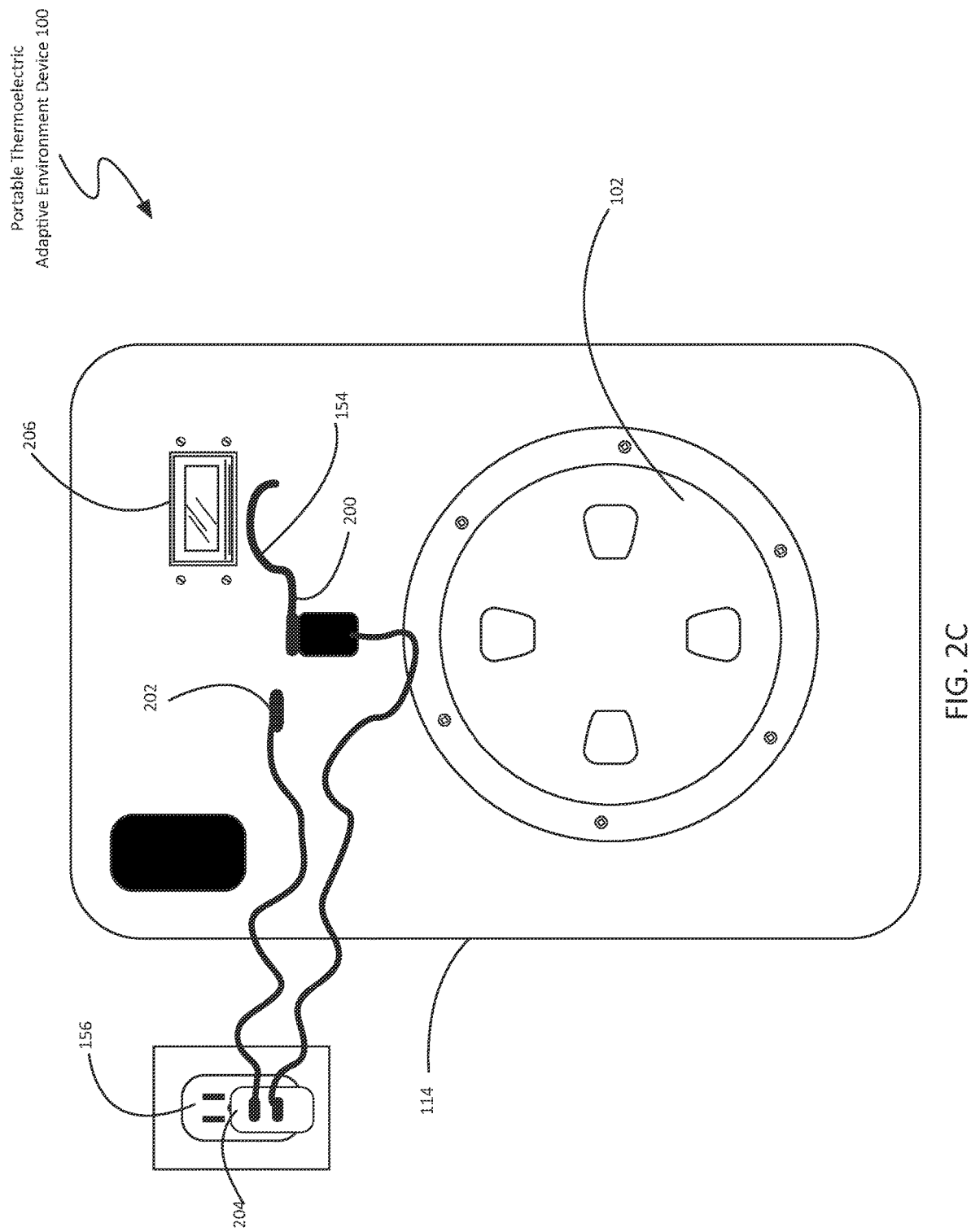

FIGS. 2A-2C are top views of a portable thermoelectric adaptive environment device 100 configured to interface with an external power source 156 according to some embodiments. Although FIGS. 2A-2C illustrate top views, in some embodiments, portable thermoelectric adaptive environment device 100 may include the shown features on a different surface of housing 114 (e.g., a side, a back, or a front surface). In addition, some of the shown features may be on one surface of housing 114 with other shown features disposed on one or more other surfaces of housing 114. As shown, the device 100 in this non-limiting example has a USB-C cable 200 and a USB-C port 202 on the front. The cable 200 is communicatively coupled to the temperature control system 106 and can function as a power interface 154. In some embodiments, the power interface 154 (here, a cable 200) may extend outside the housing 114. The port 202 is communicatively coupled to the battery 112 inside the housing 114, and is configured to receive and releasably couple to the cable 200 such that the battery 112 is communicatively coupled to the temperature control system 106 through the cable 200.

FIG. 2B shows the cord plugged into the port 202, meaning the device 100 is being powered by the battery 112. In FIG. 2C, both the port 202 and the cable 200 are coupled to male and female wires that are plugged into a wall socket through a power adapter 204 that may be stored within the housing 114 when not in use (i.e., see upper left-hand corner of device 100 face in FIGS. 2A and 2B), allowing the device 100 to be powered while the battery 112 is being charged. Other embodiments may be configured with a single port 202/cable 200 extending from the housing 114, with internal coupling allowing for charging and/or utilizing the battery 112. In some embodiments, one or both cords plugged into the wall may comprise a meter indicating the nature of the energy flowing through it (e.g., voltage 124, current 126, power 128, etc.). In other embodiments, such information may be provided by the device 100 itself through a display 206. In some embodiments, display 206 may display temperature information, such as ambient temperature 120, internal temperature 118 of the vessel 102, or target temperature 122.

Where the above examples, embodiments and implementations reference examples, it should be understood by those of ordinary skill in the art that other components and temperature manipulation devices and examples could be intermixed or substituted with those provided. In places where the description above refers to particular embodiments of a portable thermoelectric adaptive environment device, it should be readily apparent that a number of modifications may be made without departing from the spirit thereof and that these embodiments and implementations may be applied to other adaptive environment technologies as well. Accordingly, the disclosed subject matter is intended to embrace all such alterations, modifications and variations that fall within the spirit and scope of the disclosure and the knowledge of one of ordinary skill in the art.

What is claimed is:

1. A portable thermoelectric adaptive environment device comprising:
   a vessel for holding temperature sensitive goods;
   a thermoelectric heat pump in thermal contact with the vessel;
   a temperature control system communicatively coupled to the thermoelectric heat pump and a battery, the temperature control system comprising a microcontroller and a plurality of sensors configured to monitor at least an internal temperature of the vessel and an ambient temperature proximate the portable thermoelectric adaptive environment device, the microcontroller communicatively coupled to the battery through at least one trigger configured to communicate with the battery using a two-way communication protocol, the microcontroller configured to maintain the vessel at a target temperature by instructing a trigger of the at least one trigger to request a voltage and a current from the battery through a request made using the two-way communication protocol and powering the thermoelectric heat pump at the voltage and the current provided by the battery in response to the request; and
   a housing enclosing the vessel, the thermoelectric heat pump, the battery, and the temperature control system.

2. The device of claim 1, wherein the at least one trigger comprises a plurality of static triggers, each static trigger of the plurality of static triggers configured to request a predefined voltage and a predefined current from the battery using the two-way communication protocol, the request being made in response to an instruction received by the static trigger from the microcontroller.

3. The device of claim 1, wherein the at least one trigger comprises a dynamic trigger configured to request a configurable voltage and a configurable current from the battery using the two-way communication protocol, the request being made in response to an instruction received by the dynamic trigger from the microcontroller indicating the configurable voltage and the configurable current to be requested, the configurable voltage chosen by the microcontroller from a range of voltages, the configurable current chosen by the microcontroller from a range of currents.

4. The device of claim 1, wherein the at least one trigger is integral with the temperature control system.

5. The device of claim 1, wherein the at least one trigger is one trigger.

6. The device of claim 1, wherein the device further comprises a power interface configured to couple the temperature control system with an external power source.

7. The device of claim 6, wherein the temperature control system is further configured to instruct the battery to receive power using the two-way communication protocol and then to charge the battery while also powering the thermoelectric heat pump at the current and the voltage to maintain the vessel at the target temperature while the power interface is coupled to the external power source.

8. A portable thermoelectric adaptive environment device comprising:
   a vessel for holding temperature sensitive goods;
   a thermoelectric heat pump in thermal contact with the vessel;
   a temperature control system communicatively coupled to the thermoelectric heat pump and a battery, the temperature control system comprising a microcontroller and a plurality of sensors configured to monitor at least an internal temperature of the vessel and an ambient temperature proximate the portable thermoelectric adaptive environment device, the microcontroller configured to maintain the vessel at a target temperature by requesting a voltage and a current from the battery with a request made using a two-way communication protocol and powering the thermoelectric heat pump at the voltage and the current provided by the battery in response to the request; and
   a housing enclosing the vessel, the thermoelectric heat pump, and the temperature control system.

9. The device of claim 8, wherein the battery is inside the housing.

10. The device of claim 9, wherein the battery is removable.

11. The device of claim 8, wherein the thermoelectric heat pump is also communicatively coupled to the battery directly, such that the thermoelectric heat pump is powered directly by the battery at the voltage and the current, bypassing the temperature control system.

12. The device of claim 8, wherein the microcontroller is communicatively coupled to the battery through at least one trigger configured to communicate with the battery using the two-way communication protocol.

13. The device of claim 12, wherein the at least one trigger comprises a plurality of static triggers, each static trigger of the plurality of static triggers configured to request a predefined voltage and a predefined current from the battery using the two-way communication protocol, the request being made in response to an instruction received by the static trigger from the microcontroller.

14. The device of claim 12, wherein the at least one trigger comprises a dynamic trigger configured to request a configurable voltage and a configurable current from the battery using the two-way communication protocol, the request being made in response to an instruction received by the dynamic trigger from the microcontroller indicating the configurable voltage and the configurable current to be requested, the configurable voltage chosen by the microcontroller from a range of voltages, the configurable current chosen by the microcontroller from a range of currents.

15. The device of claim 12, wherein the at least one trigger is integral with the temperature control system.

16. The device of claim 8, wherein the two-way communication protocol is the USB Power Delivery (USB-PD) protocol.

17. The device of claim 8, wherein the two-way communication protocol is the USB Power Delivery Programmable Power Supply protocol.

18. The device of claim 8, wherein the device further comprises a power interface configured to couple the temperature control system with an external power source.

19. The device of claim 18, wherein the temperature control system is further configured to instruct the battery to receive power using the two-way communication protocol and then to charge the battery while also powering the thermoelectric heat pump at the current and the voltage to maintain the vessel at the target temperature while the power interface is coupled to the external power source.

20. The device of claim 18, wherein the power interface comprises a cable communicatively coupled to the temperature control system and extending outside the housing, and wherein the battery is inside the housing and communicatively coupled to a port configured to receive and releasably couple to the cable such that the battery is communicatively coupled to the temperature control system through the cable.

\* \* \* \* \*